United States Patent [19]

Fujii et al.

[11] Patent Number: 5,483,067
[45] Date of Patent: Jan. 9, 1996

[54] PYROELECTRIC INFRARED DETECTOR AND METHOD OF FABRICATING THE SAME

[75] Inventors: Satoru Fujii, Takatsuki; Ryoichi Takayama, Suita; Yoshihiro Tomita, Osaka; Masayuki Okano, Kobe; Hideo Torii, Higashi Osaka, all of Japan

[73] Assignee: Matsuhita Electric Industrial Co., Ltd., Japan

[21] Appl. No.: 373,103

[22] Filed: Jan. 17, 1995

Related U.S. Application Data

[62] Division of Ser. No. 135,415, Oct. 13, 1993, Pat. No. 5,413,667.

[30] Foreign Application Priority Data

Nov. 4, 1992 [JP] Japan ..................... 4-294811
Mar. 12, 1993 [JP] Japan ..................... 5-51944

[51] Int. Cl.$^6$ ..................... G01J 5/02
[52] U.S. Cl. ..................... 250/338.3
[58] Field of Search ..................... 250/338.2, 338.3

[56] References Cited

U.S. PATENT DOCUMENTS 3,773,564  11/1973  Yamaka et al. ............. 250/338.3 X
4,532,424   7/1985  Cheung .
5,293,041   3/1994  Kruse, Jr. ................. 250/338.3
5,354,732  10/1994  Tabata et al. ............. 250/338.3 X

FOREIGN PATENT DOCUMENTS 57-104380   6/1982  Japan .
58-187822  11/1983  Japan ..................... 250/338.3
62-000821   1/1987  Japan .
62-821      1/1987  Japan ..................... 250/338.3
62-046217   2/1987  Japan .
62-162369   7/1987  Japan .
62-211520   9/1987  Japan ..................... 250/338.3
1-3524      1/1989  Japan ..................... 250/338.3
1-136035    5/1989  Japan ..................... 250/338.3
4-170077    6/1992  Japan .

OTHER PUBLICATIONS

"Pyroelectric liner array infrared sensors made of c–axis–oriented La–modified PbTio$_3$ thin films" by Ryoichi Takayama et al., J. Appl. Phys. 63(12), 15 Jun. 1988, pp. 5868–5872.

Primary Examiner—Carolyn E. Fields
Assistant Examiner—Edward J. Gilick
Attorney, Agent, or Firm—Parkhurst, Wendel & Rossi

[57] ABSTRACT

A pyroelectric infrared detector includes a substrate having a recess. A pyroelectric portion substantially aligns with the recess. A resin film is located between the substrate and the pyroelectric portion. The recess faces the resin film. First and second electrodes are connected to first and second surfaces of the pyroelectric portion respectively. The pyroelectric portion may include a pyroelectric film of $Pb_xLa_yTi_zZr_wO_3$ where atomic fractions "w", "x", "y", and "z" satisfy one of following conditions a), b), and c):

a) $0.7 \leq x \leq 1$, $x+y=1$, $0.925 \leq z \leq 1$, $w=0$
b) $x=1$, $y=0$, $0.45 \leq z < 1$, $z+w=1$
c) $0.75 \leq x < 1$, $x+y=1$, $0.5 \leq z < 1$, $z+w=1$ 8 Claims, 7 Drawing Sheets

FIG. 10
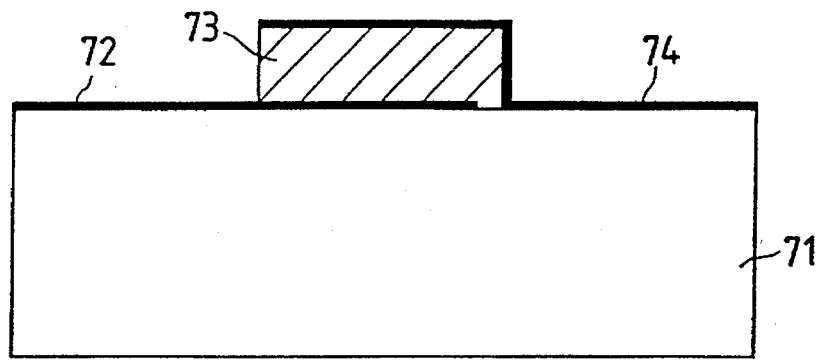
FIG. 11(a)
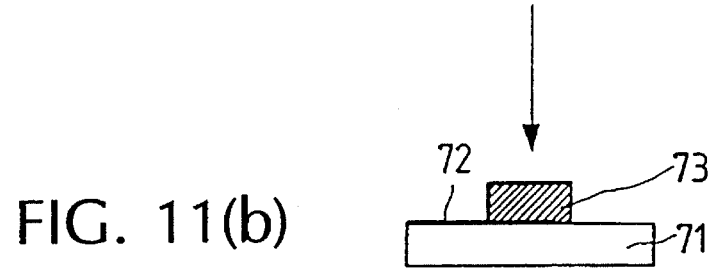
FIG. 11(b)
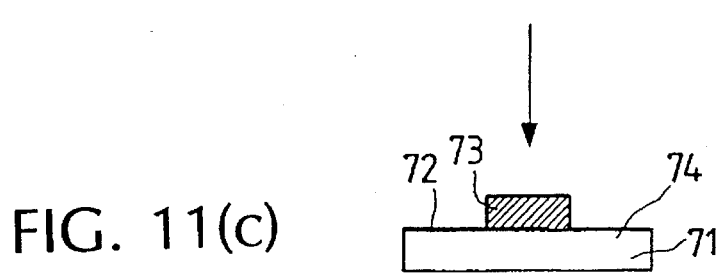
FIG. 11(c)

PYROELECTRIC INFRARED DETECTOR AND METHOD OF FABRICATING THE SAME

This is a Division of application Ser. No. 08/135,415 filed Oct. 13, 1993, now U.S. Pat. No. 5,413,667.

BACKGROUND OF THE INVENTION

1. Field of the Invention

This invention relates to a pyroelectric infrared detector. This invention also relates to a method of fabricating a pyroelectric infrared detector.

2. Description of the Prior Art

R. Takayama et al reported high sensitive pyroelectric linear array infrared sensors fabricated by using highly c-axis-oriented and spontaneous polarized La-modified $PbTiO_3$ (PLT) thin films (Journal of Applied Physics 63(12), 15 Jun. 1988, p5868-5872). The PLT thin films were deposited on (100)-orientated Pt thin film on (100)-cleaved MgO single crystals by RF magnetron sputtering. The PLT thin films had high figures of merit for voltage responsivity (Rv) and specific detectivity (D*) without a poling treatment.

Since the pyroelectric infrared sensor reported by R. Takayama et al uses an MgO single crystal as a substrate, it is generally difficult to form the pyroelectric film and an external circuit on a common substrate. The MgO substrate has a high thermal conductivity. Thus, a portion of the MgO substrate which extends directly below a major part of the pyroelectric film is etched off to suppress heat transfer from the pyroelectric film to the substrate to attain a high infrared sensitivity.

Japanese published unexamined patent application 4-170077 discloses a pyroelectric infrared detector fabricated as follows. A pyroelectric film was formed on a first substrate made of an MgO single crystal. The pyroelectric film and exposed portions of the first substrate were coated with an organic film. A second substrate having a central opening was bonded to the organic film by adhesive. Finally, the first substrate was etched off to complete the pyroelectric infrared detector in which the pyroelectric film was supported on the second substrate via the organic film. The pyroelectric film was located above the opening in the second substrate.

In the pyroelectric infrared detector of Japanese application 4-170077, the pyroelectric film was made of $Pb_xLa_y$-$Ti_zZr_wO_3$ where the atomic fractions "x", "y", "z", and "w" satisfied one of the following three different conditions (a), (b), and (c):

(a) $0.7 \leq x \leq 1$, $0.9 \leq x+y < 1$, $0.95 \leq z \leq 1$, $w=0$ (b) $x=1$, $y=0$, $0.45 \leq z < 1$, $z+w=1$ (c) $0.83 \leq x \leq 1$, $x+y=1$, $0.5 \leq z < 1$, $0.96 \leq z+w \leq 1$ During the fabrication of the pyroelectric infrared detector of Japanese application 4-170077, the first substrate made of MgO was etched off as previously described. Generally, the removal of the MgO substrate is disadvantageous in cost and time. The opening extends through walls of the second substrate. Thus, during the etching process, etchant tended to reach the organic film and the pyroelectric film via the opening in the second substrate. In this case, the etchant adversely affected the organic film and the pyroelectric film. In some cases, the pyroelectric film was broken. Thus, it is difficult to improve the yield of detectors.

SUMMARY OF THE INVENTION

It is an object of this invention to provide an improved pyroelectric infrared detector.

It is another object of this invention to provide an improved method of fabricating a pyroelectric infrared detector.

A first aspect of this invention provides a pyroelectric infrared detector comprising a substrate having a recess; a pyroelectric portion substantially aligning with the recess; a resin film located between the substrate and the pyroelectric portion, wherein the recess faces tile resin film; and first and second electrodes connected to first and second surfaces of the pyroelectric portion respectively.

A second aspect of this invention provides a method of fabricating a pyroelectric infrared detector which comprises the steps of forming a pyroelectric portion on a given area of a surface of a first substrate; forming a resin film covering the pyroelectric portion and an exposed area of the surface of the first substrate; bonding a second substrate to the resin film, wherein the second substrate having a recess which faces the resin film and which substantially aligns with the pyroelectric portion; and etching off and removing the first substrate from the pyroelectric portion and the resin film.

A third aspect of this invention provides a method of fabricating a pyroelectric infrared detector which comprises the steps of forming an under layer film of oriented oxide on a first substrate; forming a pyroelectric portion on a given area of a surface of the under layer film; forming a resin film covering the pyroelectric portion and an exposed area of the surface of the under layer film; bonding a second substrate to the resin film; and etching off the under layer film to remove the first substrate from the pyroelectric portion and the resin film.

A fourth aspect of this invention provides a pyroelectric infrared detector comprising a substrate; a bottom electrode extending on the substrate and being made of (100) oriented oxide having a crystal structure of an NaCl type; a pyroelectric portion extending on the bottom electrode; and a sensing electrode extending on the pyroelectric portion.

BRIEF DESCRIPTION OF THE DRAWINGS

FIG. 10 is a sectional view of a pyroelectric infrared detector according to Example 35 of this invention.

FIGS. 11(a)–11(c) are sectional views of a detector substrate in various states which occur at respective steps in the fabrication of the pyroelectric infrared detector according to Example 35 of this invention.

DESCRIPTION OF THE PREFERRED EMBODIMENTS

Figure 1:
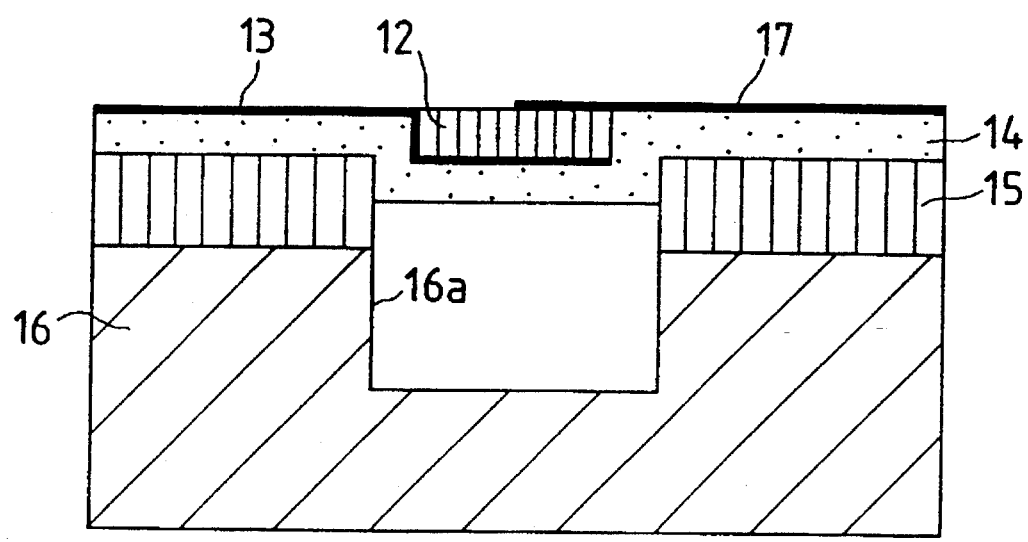
FIG. 1 is a sectional view of a pyroelectric infrared detector according to Example 1 of this invention.

A pyroelectric infrared detector according to a first embodiment of this invention includes a substrate having a recess; a pyroelectric portion substantially aligning with the recess; a resin film located between the substrate and the pyroelectric portion, wherein the recess faces the resin film; and first and second electrodes connected to first and second surfaces of the pyroelectric portion respectively.

It is preferable that the pyroelectric portion includes a pyroelectric film of $Pb_xLa_yTi_zZr_wO_3$ where atomic fractions "w", "x", "y", and "z" satisfy one of following conditions a), b), and c):

a) $0.7 \leq x \leq 1$, $x+y=1$, $0.925 \leq z \leq 1$, $w=0$ b) $x=1$, $y=0$, $0.45 \leq z < 1$, $z+w=1$ c) $0.75 \leq x < 1$, $x+y=1$, $0.5 \leq z < 1$, $z+w=1$ When the conditions b) are satisfied, the crystal structure of $Pb_xLa_yTi_zZr_wO_3$ is limited to a tetragonal system. In this case, better infrared detecting characteristics are attained provided that the axis of polarization in the pyroelectric crystal is set perpendicular to a major surface of the substrate.

The pyroelectric portion may include a pyroelectric film oriented in a direction along an axis of polarization.

According to a second embodiment of this invention, a method of fabricating a pyroelectric infrared detector includes the steps of forming a pyroelectric portion on a given area of a surface of a first substrate; forming a resin film covering the pyroelectric portion and an exposed area of the surface of the first substrate; bonding a second substrate to the resin film, wherein the second substrate having a recess which faces the resin film and which substantially aligns with the pyroelectric portion; and etching off and removing the first substrate from the pyroelectric portion and the resin film.

The first substrate may be made of a material which allows the pyroelectric portion to be oriented in a direction of polarization, and which can be easily etched off.

According to a third embodiment of this invention, a method of fabricating a pyroelectric infrared detector includes the steps of forming an under layer film of oriented oxide on a first substrate; forming a pyroelectric portion on a given area of a surface of the under layer film; forming a resin film covering the pyroelectric portion and an exposed area of the surface of the under layer film; bonding a second substrate to the resin film; and etching off the under layer film to remove the under layer film and the first substrate from the pyroelectric portion and the resin film.

The under-layer-film forming step may include depositing the under layer film on the first substrate by a plasma-enhanced MO-CVD process, and using a vapor of an organometallic complex as a source gas.

The under-layer-film forming step may include depositing the under layer film on the first substrate by a sputtering process.

The under layer film may be made of a material which allows the pyroelectric portion to be oriented in a direction of polarization, and which can be easily etched off.

The under layer film may have a crystal structure of an NaCl type.

The under layer film may be made of MgO or NiO.

A pyroelectric infrared detector according to a fourth embodiment of this invention includes a substrate; a bottom electrode extending on the substrate and being made of (100) oriented oxide having a crystal structure of an NaCl type; a pyroelectric portion extending on the bottom electrode; and a sensing electrode extending on the pyroelectric portion.

It is preferable that the pyroelectric portion includes a pyroelectric film of (001) oriented $Pb_xLa_yTi_zZr_wO_3$ where atomic fractions "w", "x", "y", and "z" satisfy one of following conditions a), b), and c):

a) $0.7 \leq x \leq 1$, $x+y=1$, $0.925 \leq z \leq 1$, $w=0$ b) $x=1$, $y=0$, $0.45 \leq z < 1$, $z+w=1$ c) $0.75 \leq x < 1$, $x+y=1$, $0.5 \leq z < 1$, $z+w=1$ When the conditions b) are satisfied, the crystal structure of $Pb_xLa_yTi_zZr_wO_3$ is limited to a tetragonal system. In this case, better infrared detecting characteristics are attained provided that the axis of polarization in the pyroelectric crystal is set perpendicular to a major surface of the substrate. The bottom electrode may be made of (100) oriented NiO.

EXAMPLE 1

With reference to FIG. 1, a pyroelectric infrared detector according to Example 1 includes a substrate 16 which has a central recess 16a at the upper surface thereof. A resin film 14 extending above the substrate 16 is bonded to the substrate 16 via an adhesive layer 15. The adhesive layer 15 extends outward of the recess 16a. The adhesive layer 15 is sandwiched between the substrate 16 and the resin film 14. An upper surface of the resin film 14 has a recess filled with a pyroelectric film 12. An upper surface of the pyroelectric film 12 is substantially flush with the upper surface of the resin film 14. An electrode layer 13 extends between a lower surface of the pyroelectric film 12 and the resin film 14, extending upward along a side of the pyroelectric film 12 and then extending outward along the upper surface of the resin film 14. Another electrode layer 17 extends on a given area of the upper surface of the pyroelectric film 12, and then extends outward along the upper surface of the resin film 14. In this way, the electrode layers 13 and 17 are electrically connected to the lower and upper surfaces of the pyroelectric film 12 respectively.

The substrate 16 is spaced from the resin film 14 by the adhesive layer 15. The substrate 16, the resin film 14, and the adhesive layer 15 define an inner space, the lower portion of which is formed by the recess 16a in the substrate 16. The pyroelectric film 12 substantially aligns with the inner space and the recess 16a in the substrate 16. In addition, the pyroelectric film 12 is located above the inner space, and is separated therefrom by the resin film 14. Accordingly, the resin film 14 and the inner space suppress the escape of heat from the pyroelectric film 12 to the substrate 16. This design enables a high infrared sensitivity.

The pyroelectric film 12 is made of $Pb_{0.9}La_{0.1}Ti_{0.975}O_3$. The electrode layers 13 and 17 are made of Ni—Cr. The resin film 14 is made of polyimide resin. The adhesive layer 15 is made of epoxy resin. The substrate 16 is made of alumina ($Al_2O_3$).

Figure 2A:
FIGS. 2(a)–2(g) are sectional views of a detector substrate in various states which occur at respective steps in the fabrication of the pyroelectric infrared detector according to Example 1 of this invention.
Figure 2B:
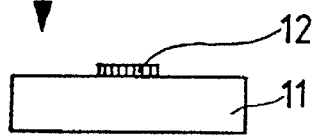

The pyroelectric infrared detector of FIG. 1 was fabricated as follows. With reference to FIG. 2(a), a first substrate 11 made of a (100) oriented MgO single crystal was prepared. As shown in FIG. 2(b), a pyroelectric film 12 made of $Pb_{0.9}La_{0.1}Ti_{0.975}O_3$ was formed on the first substrate 11.

The formation of the pyroelectric film 12 used an RF magnetron sputtering apparatus. Specifically, the first substrate 11 was provided with a stainless mask having a thickness of 0.2 mm and having a configuration corresponding to a desired shape of the pyroelectric film 12. The first substrate 11 with the mask was attached to a stainless holder in the RF magnetron sputtering apparatus. A mixture of PbO powder, $La_3O_2$ powder, and $TiO_2$ powder was used as a target placed in a copper dish in the RF magnetron sputtering apparatus. The mixing ratio among the PbO powder, the $La_3O_2$ powder, and the $TiO_2$ powder was chosen so that the amount of the PbO powder was in excess of the amount corresponding to the composition of the pyroelectric film 12 by 20 mol %. The RF magnetron sputtering apparatus was activated so that a pyroelectric film 12 was deposited on a given area (an exposed area) of the first substrate 11 by sputtering. During the sputtering, the first substrate 11 remained heated at a temperature of 600° C. Furthermore, sputtering gas composed of a mixture of argon (90%) and oxygen (10%) was used in the RF magnetron sputtering apparatus. The pressure of the sputtering gas was equal to 0.9 Pa. The RF power density in the RF magnetron sputtering apparatus was equal to 2.0 W/cm². The RF power had a frequency of 13.56 MHz. The pyroelectric film 12 had a thickness of 3 μm.

Figure 2C:
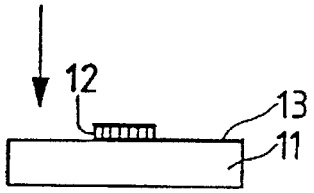

After the formation of the pyroelectric film 12, an Ni—Cr film having a thickness of 100 nm was formed on the pyroelectric film 12 and a given area of the first substrate 11 by sputtering. As shown in FIG. 2(c), the Ni—Cr film was made into an electrode layer 13 and extensions thereof by a patterning process using photolithography.

Figure 2D:
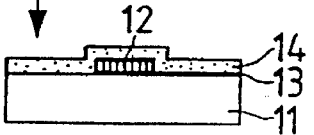
Figure 2E:
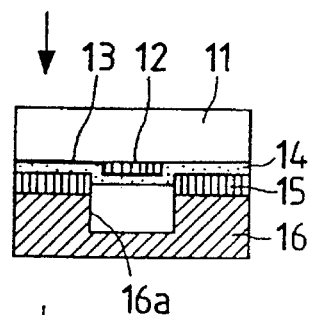

Subsequently, as shown in FIG. 2(d), polyimide resin was applied to exposed areas of the first substrate 11, the electrode layer 13, and the pyroelectric film 12 by spin coat, being polymerized into a resin film 14. As shown in FIG. 2(e), epoxy resin forming an adhesive layer 15 was applied to given areas of the resin film 14. Then, a second substrate 16 was attached to the resin film 14 on the first substrate 11 by the adhesive layer 15. The adhesive layer 15 was hardened or polymerized, completely bonding the resin film 14 and the second substrate 16 together. The second substrate 16 had a central recess 16a facing the resin film 14. The second substrate 16 was made of alumina ($AL_2O_3$).

Figure 2F:
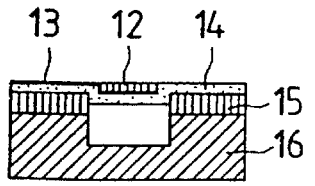
Figure 2G:
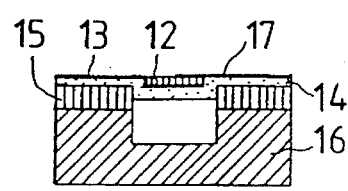

Subsequently, the first substrate 11 was etched off by etchant such as an aqueous solution of orthophosphoric acid. Thus, as shown in FIG. 2(f), the first substrate 11 was removed from the pyroelectric film 12, the resin film 14, and the electrode layer 13. Finally, as shown in FIG. 2(g), an Ni—Cr film having a thickness of 10 nm was formed on given regions of exposed areas of the pyroelectric film 12 and the resin film 14, being made into an electrode layer 17 and extensions thereof by a patterning process. Since the exposed areas of the pyroelectric film 12 and the resin film 14 were flat and flush with each other, the patterning of the electrode layer 17 was easy.

The second substrate 16 was previously provided with a wiring pattern made of Ag—Pd conductive paste. This design enabled the pyroelectric film 12 and a peripheral circuit (an external circuit) to be mounted on a common substrate, that is, the second substrate 16. Therefore, the pyroelectric infrared detector was small in size.

During the etching process to remove the first substrate 11, the recessed configuration of the second substrate 16 prevented the etchant from entering the inner space and then reaching the resin film 14 and the pyroelectric film 12.

Samples of the pyroelectric infrared detector according to Example 1 were prepared. Experiments were performed on these samples which were not subjected to a poling treatment. With respect to the samples, the productive yield was equal to 92%. The sensing portions of the samples had a pyroelectric coefficient "γ" of $5.5 \times 10^{-8}$ C/cm²K, a relative dielectric constant $\epsilon r$ of 180, and a volume specific heat Cv of 3.2 Jcm³K. Thus, the samples had a merit figure Fv ($=\gamma/Cv\epsilon r$) of $0.95 \times 10^{-10}$ Ccm/J. The merit figure Fv corresponds to a figure of merit for voltage responsivity (Rv). The relative dielectric constant of each of the samples was measured by using an LCR meter with a frequency of 1 kHz and an applied voltage of 1 V. The pyroelectric coefficient of the samples was represented by an average value in a temperature variation between 20°–30° C.

Samples of a reference pyroelectric infrared detector were prepared. The reference pyroelectric infrared detector is designed so that a substrate has a through hole (a through opening) instead of a recess as in the prior art pyroelectric infrared detector of Japanese application 4-170077. During an etching process in the fabrication of the reference pyroelectric infrared detector, etchant reached a resin film and a pyroelectric film via the opening in the substrate and hence adversely affected the resin film and the pyroelectric film. Experiments were performed on the samples of the reference pyroelectric infrared detector which were not subjected to a poling treatment. With respect to these samples, the productive yield was equal to 60%. The sensing portions of the samples had a pyroelectric coefficient "γ" of $4.8 \times 10^{-8}$ C/cm²K, a relative dielectric constant γr of 190, and a volume specific heat Cv of 3.2 Jcm³K. Thus, the samples had a merit figure Fv ($=\gamma/Cv\epsilon r$) of $0.79 \times 10^{-10}$ Ccm/J. The relative dielectric constant of each of the samples was measured by using an LCR meter with a frequency of 1 kHz and an applied voltage of 1 V. The pyroelectric coefficient of the samples was represented by an average value in a temperature variation between 20°–30° C.

EXAMPLE 2

A pyroelectric infrared detector according to Example 2 is similar to the pyroelectric infrared detector of Example 1 except for design changes indicated hereinafter. In the pyroelectric infrared detector of Example 2, a pyroelectric film 12 is made of $PbTiO_3$.

During the fabrication of the pyroelectric infrared detector of Example 2, the pyroelectric film 12 was formed on a first substrate 11 by using a plasma-enhanced MO-CVD apparatus.

Figure 3:
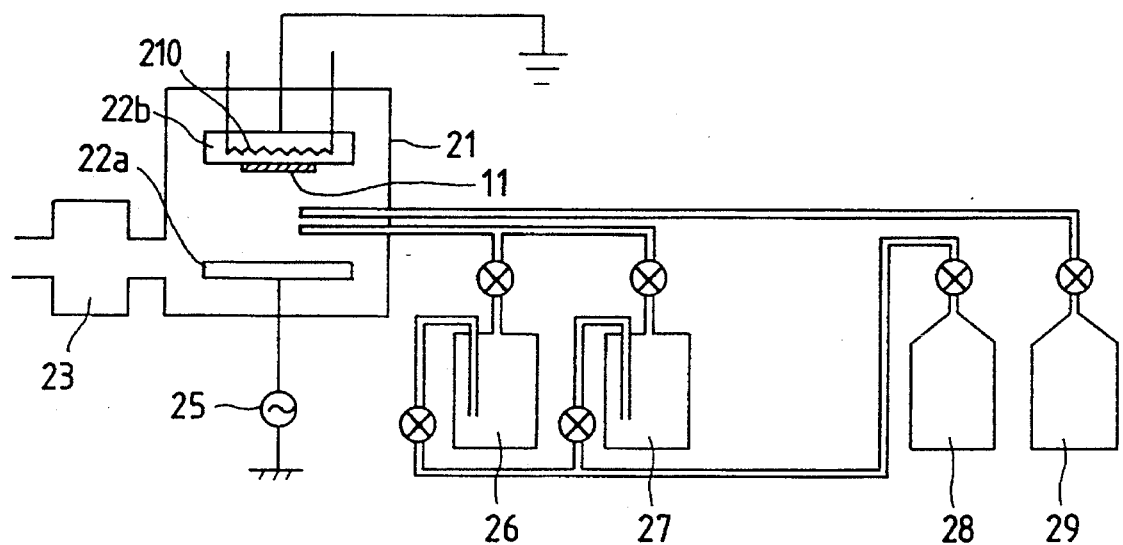
FIG. 3 is a diagram of a plasma-enhanced MO-CVD apparatus used in the fabrication of a pyroelectric infrared detector according to Example 2 of this invention.

Specifically, as shown in FIG. 3, a first substrate 11 was placed in a reaction chamber 21 of the plasma-enhanced MO-CVD apparatus. The first substrate 11 was previously heated at a temperature of 450° C. by a heater 210. The first substrate 11 was supported on a ground electrode 22b. Lead dipivaloyl methane, $Pb(C_{11}H_{19}O_2)_2$, was placed in a source vaporizer 26 and was heated by using an oil bath held at a temperature of 130° C. Lead dipivaloyl methane was vaporized as being heated. Titanium tetra-isopropoxide, $Ti(i-C_3H_7O)_4$, was placed in a source vaporizer 27 and was heated by using an oil bath held at a temperature of 50° C. Titanium tetra-isopropoxide was vaporized as being heated. Resultant lead dipivaloyl methane vapor and titanium tetra-isopropoxide vapor were driven into the reaction chamber 21 by using carrier nitrogen gas which flowed from a carrier gas cylinder 28 at a rate of 10 ml/min. Oxygen gas serving as reactant gas flowed from a reactant gas cylinder 29 at a rate of 40 ml/min, and was driven into the reaction chamber 21 via an injection nozzle. The reaction chamber 21 was exhausted via an exhaust system 23 so that the pressure in the reaction chamber 21 was held equal to a vacuum of 3.90 Pa.

Under these conditions, electromagnetic wave having a frequency of 13.56 MHz was applied from an RF power source 25 to an RF electrode 22a at a power of 400 W for 100 minutes so that plasma was generated between the RF electrode 22a and the ground electrode 22b in the reaction chamber 21 of the plasma-enhanced MO-CVD apparatus. As a result, a (001) oriented $PbTiO_3$ pyroelectric film 12 was deposited on a surface of the first substrate 11. The $PbTiO_3$ pyroelectric film 12 had a thickness of 3 μm. During the formation of the $PbTiO_3$ pyroelectric film 12, the first substrate 11 was rotated at 120 r.p.m. by a motor (not shown).

Samples of the pyroelectric infrared detector according to Example 2 were prepared. Experiments were performed on these samples which were not subjected to a poling treatment. With respect to the samples, the productive yield was equal to 91%. The sensing portions of the samples had a pyroelectric coefficient "γ" of $2.8 \times 10^{-8}$ $C/cm^2K$, a relative dielectric constant $\epsilon r$ of 95, and a volume specific heat Cv of 3.2 $Jcm^3K$. Thus, the samples had a merit figure Fv $(=\gamma/Cv\epsilon r)$ of $0.92 \times 10^{-10}$ Ccm/J. The relative dielectric constant of each of the samples was measured by using an LCR meter with a frequency of 1 kHz and an applied voltage of 1 V. The pyroelectric coefficient of the samples was represented by an average value in a temperature variation between 20°–30° C.

EXAMPLE 3

Figure 4:
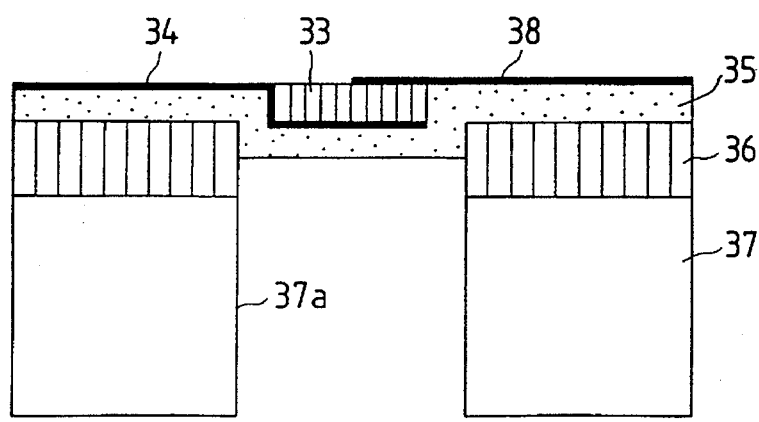
FIG. 4 is a sectional view of a pyroelectric infrared detector according to Example 3 of this invention.

With reference to FIG. 4, a pyroelectric infrared detector according to Example 3 includes a substrate 37 which has a central opening or hole 37a extending therethrough. A resin film 35 extending above the substrate 37 is bonded to the substrate 37 via an adhesive layer 36. The adhesive layer 36 extends outward of the opening 37a. The adhesive layer 36 is sandwiched between the substrate 37 and the resin film 35. An upper surface of the resin film 35 has a recess filled with a pyroelectric film 33. An upper surface of the pyroelectric film 33 is substantially flush with the upper surface of the resin film 35. An electrode layer 34 extends between a lower surface of the pyroelectric film 33 and the resin film 35, extending upward along a side of the pyroelectric film 33 and then extending outward along the upper surface of the resin film 35. Another electrode layer 38 extends on a given area of the upper surface of the pyroelectric film 33, and then extends outward along the upper surface of the resin film 35. In this way, the electrode layers 34 and 38 are electrically connected to the lower and upper surfaces of the pyroelectric film 33 respectively.

The substrate 37 is spaced from the resin film 35 by the adhesive layer 36. The substrate 37, the resin film 35, and the adhesive layer 36 define a downwardly-facing recess, the lower portion of which is formed by the opening 37a in the substrate 37. The pyroelectric film 33 substantially aligns with the downwardly-facing recess. In addition, the pyroelectric film 33 is located above the downwardly-facing recess, and is separated therefrom by the resin film 35. Accordingly, the resin film 35 and the downwardly-facing recess suppress the escape of heat from the pyroelectric film 33 to the substrate 37. This design enables a high infrared sensitivity.

The pyroelectric film 33 is made of $Pb_{0.9}La_{0.1}Ti_{0.975}O_3$. The electrode layers 34 and 38 are made of Ni—Cr. The resin film 35 is made of polyimide resin. The adhesive layer 36 is made of epoxy resin or silicone resin. The substrate 37 is made of alumina ($AL_2O_3$).

Figure 5A:
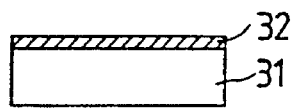
FIGS. 5(a)–5(g) are sectional views of a detector substrate in various states which occur at respective steps in the fabrication of the pyroelectric infrared detector according to Example 3 of this invention.

The pyroelectric infrared detector of FIG. 4 was fabricated as follows. With reference to FIG. 5(a), a first substrate 31 made of stainless steel was prepared. The first substrate 31 had a thermal expansion coefficient of $18 \times 10^{-6°}$ $C^{-1}$. An oxide under layer film 32 made of a (100) oriented MgO crystal was formed on the first substrate 31 by a plasma-enhanced MO-CVD apparatus. The oxide under layer film 32 had a crystal structure of the NaCl type.

Figure 6:
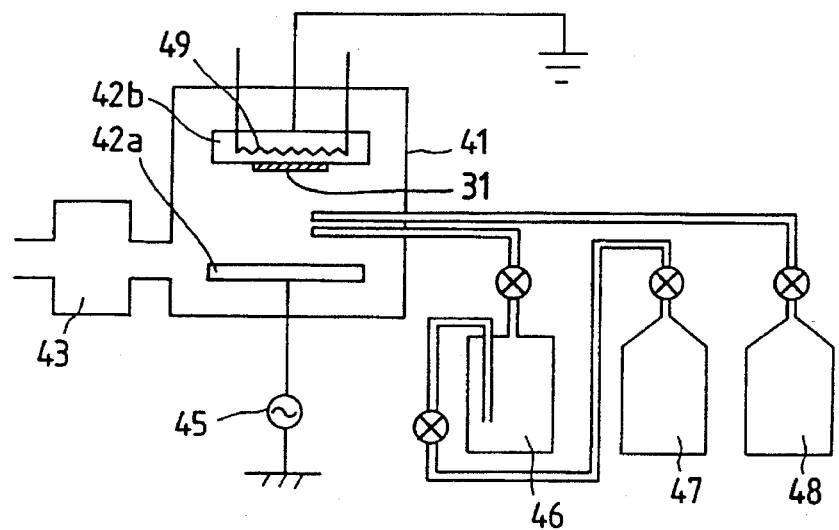
FIG. 6 is a diagram of a plasma-enhanced MO-CVD apparatus used in the fabrication of the pyroelectric infrared detector according to Example 3 of this invention.

Specifically, as shown in FIG. 6, the first substrate 31 was placed in a reaction chamber 41 of the plasma-enhanced MO-CVD apparatus. The first substrate 31 was previously heated at a temperature of 350° C. by a heater 49. The first substrate 31 was supported on a ground electrode 42b. Magnesium acetylacetonate, $Mg(C_5H_7O_2)_2$, was placed in a source vaporizer 46 and was heated by using an oil bath held at a temperature of 190° C. Magnesium acetylacetonate was vaporized as being heated. Resultant magnesium acetylacetonate vapor was driven into the reaction chamber 41 by using carrier nitrogen gas which flowed from a carrier gas cylinder 47 at a rate of 10 ml/min. Oxygen gas serving as reactant gas flowed from a reactant gas cylinder 48 at a rate of 12 ml/min, and was driven into the reaction chamber 41 via an injection nozzle. The reaction chamber 41 was exhausted via an exhaust system 43 so that the pressure in the reaction chamber 41 was held equal to a vacuum of 7.90 Pa.

Under these conditions, electromagnetic wave having a frequency of 13.56 MHz was applied from an RF power source 45 to an RF electrode 42a at a power of 400 W for 10 minutes so that plasma was generated between the RF electrode 42a and the ground electrode 42b in the reaction chamber 41 of the plasma-enhanced MO-CVD apparatus. As a result, an MgO under layer film 32 was deposited on a surface of the first substrate 31. The oxide under layer film 32 was made of MgO polycrystal which had an NaCl-type structure and which was oriented along a <100>-axis in the vertical direction of the first substrate 31. The oxide under layer film 32 had a thickness of 2,000 angstroms. During the formation of the oxide under layer film 32, the first substrate 31 was rotated at 120 r.p.m. by a motor (not shown).

Figure 5B:
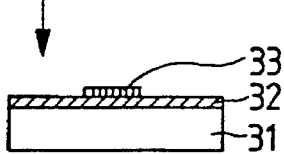

With reference to FIG. 5(b), after the oxide under layer film 32 was formed on the first substrate 31, a pyroelectric film 33 made of $Pb_{0.9}La_{0.1}Ti_{0.975}O_3$ was formed on the oxide under layer film 32 by RF magnetron sputtering as in Example 1.

Figure 5C:
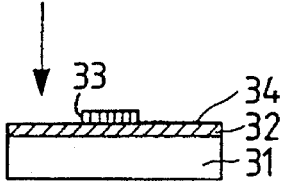

After the formation of the pyroelectric film 33, an Ni—Cr film having a thickness of 100 nm was formed on the pyroelectric film 33 and a given area of the oxide under layer film 32 by sputtering. As shown in FIG. 5(c), the Ni—Cr film was made into an electrode layer 34 and extensions thereof by a patterning process using photolithography.

Figure 5D:
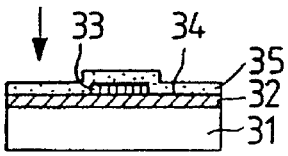
Figure 5E:
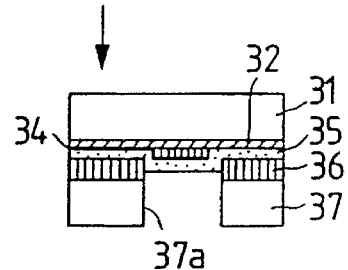

Subsequently, as shown in FIG. 5(d), polyimide resin was applied to exposed areas of the oxide under layer film 32, the electrode layer 34, and the pyroelectric film 33 by spin coat, being polymerized into a resin film 35. As shown in FIG. 5(e), silicone resin or epoxy resin forming an adhesive layer 36 was applied to given areas of the resin film 35. Then, a second substrate 37 was attached to the resin film 35 on the first substrate 31 by the adhesive layer 36. The adhesive layer 36 was polymerized, completely bonding the resin film 35 and the second substrate 37 together. The second substrate 37 had a central opening or hole 37a located below the pyroelectric film 33. The second substrate 37 was made of alumina ($Al_2O_3$).

Figure 5F:
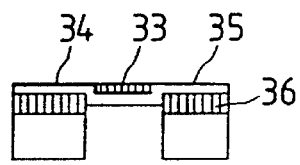
Figure 5G:
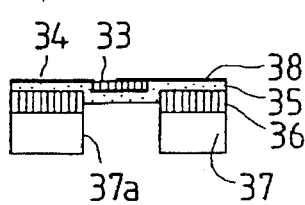

Subsequently, the oxide under layer film 32 was etched off by etchant such as an aqueous solution of orthophosphoric acid. Thus, as shown in FIG. 5(f), the first substrate 31 was removed from the pyroelectric film 33, the resin film 35, and the electrode layer 34. Finally, as shown in FIG. 5(g), an Ni—Cr film having a thickness of 10 nm was formed on given regions of exposed areas of the pyroelectric film 33 and the resin film 35, being made into an electrode layer 38 and extensions thereof by a patterning process. Since the exposed areas of the pyroelectric film 33 and the resin film 35 were flat and flush with each other, the patterning of the electrode layer 38 was easy.

The second substrate 37 was previously provided with a wiring pattern made of Ag—Pd conductive paste. This design enabled the pyroelectric film 33 and a peripheral circuit (an external circuit) to be mounted on a common substrate, that is, the second substrate 37. Therefore, the pyroelectric infrared detector was small in size.

The first substrate 31 was automatically removed by etching off the oxide under layer film 32. The polycrystalline state of the oxide under layer film 32 enabled an etching rate significantly greater than the etching rate related to an MgO single crystal. Thus, the time necessary for the etching process was relatively short, and was equal to about 70 minutes. The oxide under layer film 32 was etched off along directions (inward directions) from the sides to the center thereof. The short time for the etching was advantageous in uniformness of the etching and in protecting the pyroelectric film 33 from the etchant.

Samples of the pyroelectric infrared detector according to Example 3 were prepared. Experiments were performed on these samples which were not subjected to a poling treatment. With respect to the samples, the productive yield was equal to 91%. The sensing portions of the samples had a pyroelectric coefficient "$\gamma$" of $3.4 \times 10^{-8}$ $C/cm^2K$, a relative dielectric constant $\epsilon r$ of 179, and a volume specific heat Cv of 3.2 $Jcm^3K$. Thus, the samples had a merit figure Fv ($=\gamma/Cv\epsilon r$) of $0.59 \times 10^{-10}$ Ccm/J. The relative dielectric constant of each of the samples was measured by using an LCR meter with a frequency of 1 kHz and an applied voltage of 1 V. The pyroelectric coefficient of the samples was represented by an average value in a temperature variation between 20°–30° C.

Figure 7:
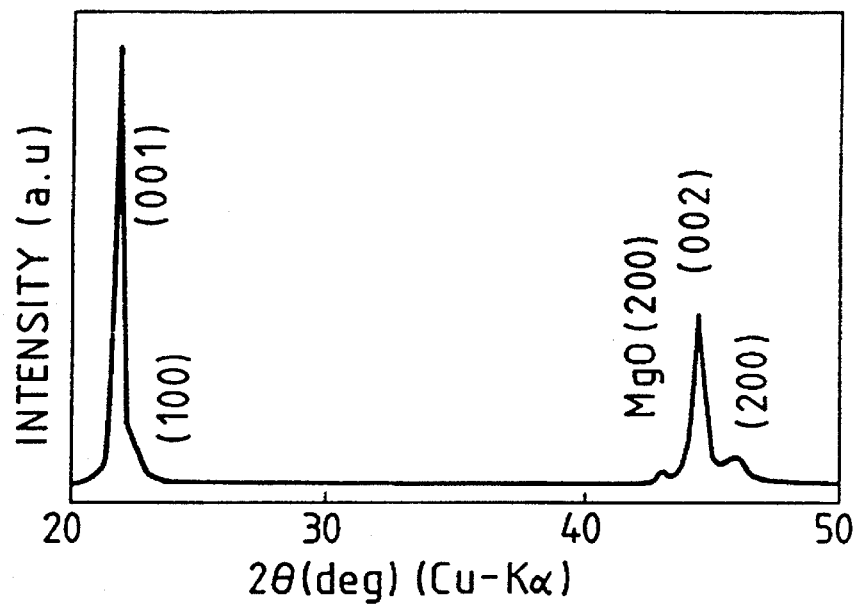
FIG. 7 is a diagram of an x-ray diffraction pattern of a sample of a pyroelectric film in the pyroelectric infrared detector according to Example 3 of this invention.

A sample of the $Pb_{0.9}La_{0.1}Ti_{0.975}O_3$ pyroelectric film 33 was prepared on the (100) oriented MgO under layer film 32. Experiments were performed to analyze this sample by x-ray diffraction. FIG. 7 shows an experimentally-obtained x-ray diffraction pattern of the sample in which (001), (100), (002), and (200) denote the intensities of reflection at related crystal planes. The rate or percentage "$\alpha$" of the c-axis orientation of the sample was calculated by referring to the following equation:

$$\alpha(\%) = \frac{I(001)}{I(001)+I(100)+I(101)+I(111)+I(110)} \times 100 \quad (1)$$

where I(001), I(100), I(101), I(111), and I(110) denoted the intensities of reflection at crystal planes (001), (100), (101), (111), and (110) respectively. The result of the calculation of the rate "$\alpha$" was equal to 90%. It should be noted that the c-axis orientation means (001)-plane orientation.

EXAMPLE 4

A pyroelectric infrared detector according to Example 4 is similar to the pyroelectric infrared detector of Example 3 (see FIGS. 4 and 5(a)–5(g)) except for design changes indicated hereinafter.

During the fabrication of the pyroelectric infrared detector of Example 4, an oxide under layer film 32 made of a (100) oriented NiO was formed on a first substrate 31 by a plasma-enhanced MO-CVD apparatus. The oxide under layer film 32 had a crystal structure of the NaCl type.

Specifically, as shown in FIG. 6, the first substrate 31 was placed in a reaction chamber 41 of the plasma-enhanced MO-CVD apparatus. The first substrate 31 was previously heated at a temperature of 350° C. by a heater 49. The first substrate 31 was supported on a ground electrode 42b. Nickel acetylacetonate, $Ni(C_5H_7O_2)_2H_2O$, was placed in a source vaporizer 46 and was heated by using an oil bath held at a temperature of 160° C. Nickel acetylacetonate was vaporized as being heated. Resultant nickel acetylacetonate vapor was driven into the reaction chamber 41 by using carrier nitrogen gas which flowed from a carrier gas cylinder 47 at a rate of 35 ml/min. Oxygen gas serving as reactant gas flowed from a reactant gas cylinder 48 at a rate of 15 ml/min, and was driven into the reaction chamber 41 via an injection nozzle. The reaction chamber 41 was exhausted via an exhaust system 43 so that the pressure in the reaction chamber 41 was held equal to a vacuum of 7.90 Pa.

Under these conditions, electromagnetic wave having a frequency of 13.56 MHz was applied from an RF power source 45 to an RF electrode 42a at a power of 400 W for 10 minutes so that plasma was generated between the RF electrode 42a and the ground electrode 42b in the reaction chamber 41 of the plasma-enhanced MO-CVD apparatus. As a result, an NiO under layer film 32 was deposited on a surface of the first substrate 31. The oxide under layer film 32 was made of NiO polycrystal which had an NaCl-type structure and which was oriented along a <100>-axis in the vertical direction of the first substrate 31. The oxide under layer film 32 had a thickness of 2,000 angstroms. During the formation of the oxide under layer film 32, the first substrate 31 was rotated at 120 r.p.m. by a motor (not shown).

After the oxide under layer film 32 was formed on the first substrate 31, a pyroelectric film 33 made of $Pb_{0.9}La_{0.1}Ti_{0.975}O_3$ was formed on the oxide under layer film 32 by RF magnetron sputtering as in Example 1.

During a later stage, the NiO under layer film 32 was etched off as the MgO under layer film 32 was removed in Example 3. The time necessary for the etching process was equal to about 75 minutes.

Samples of the pyroelectric infrared detector according to Example 4 were prepared. Experiments were performed on these samples which were not subjected to a poling treatment. With respect to the samples, the productive yield was equal to 90%. The sensing portions of the samples had a pyroelectric coefficient "$\gamma$" of $3.3 \times 10^{-8}$ $C/cm^2K$, a relative dielectric constant $\epsilon r$ of 176, and a volume specific heat Cv of 3.2 $Jcm^3K$. Thus, the samples had a merit figure Fv ($=\gamma/Cv\epsilon r$) of $0.59 \times 10^{-10}$ Ccm/J. The relative dielectric constant of each of the samples was measured by using an LCR meter with a frequency of 1 kHz and an applied voltage of 1 V. The pyroelectric coefficient of the samples was represented by an average value in a temperature variation between 20°–30° C.

Figure 8:
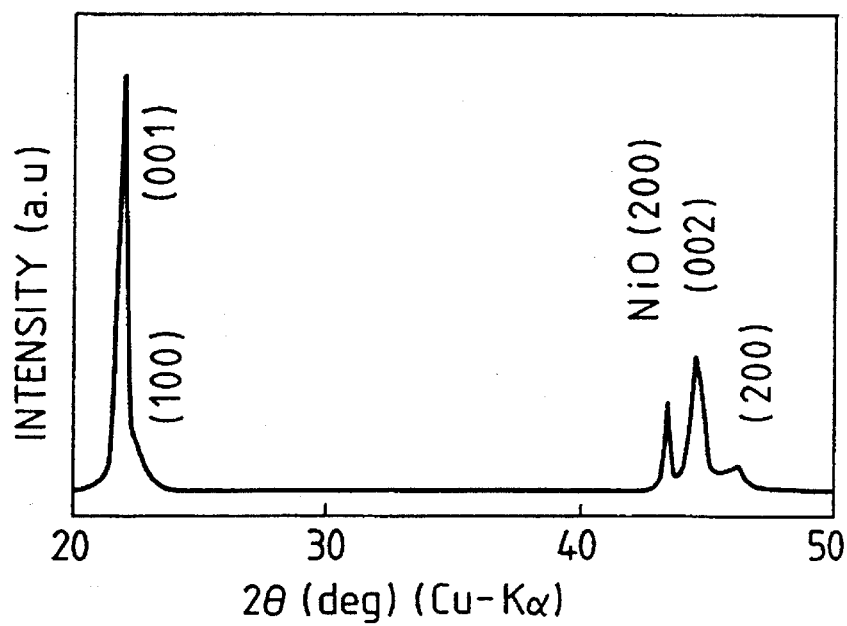
FIG. 8 is a diagram of an x-ray diffraction pattern of a sample of a pyroelectric film in a pyroelectric infrared detector according to Example 4 of this invention.

A sample of the $Pb_{0.9}La_{0.1}Ti_{0.975}O_3$ pyroelectric film 33 was prepared on the (100) oriented NiO under layer film 32. Experiments were performed to analyze this sample by x-ray diffraction. FIG. 8 shows an experimentally-obtained x-ray diffraction pattern of the sample in which (001), (100), (002), and (200) denote the intensities of reflection at related crystal planes. The rate or percentage "α" of the c-axis orientation of the sample was calculated by referring to the previously-mentioned equation (1). The result of the calculation of the rate "α" was equal to 90%. It should be noted that the c-axis orientation means (001)-plane orientation.

EXAMPLE 5

A pyroelectric infrared detector according to Example 5 is similar to the pyroelectric infrared detector of Example 3 except that a substrate 37 (see FIG. 4) has a recess instead of a through hole (a through opening) as the substrate 16 of FIG. 1.

Samples of the pyroelectric infrared detector according to Example 5 were prepared. Experiments were performed on these samples which were not subjected to a poling treatment. With respect to the samples, the productive yield was equal to 90%. The sensing portions of the samples had a pyroelectric coefficient "γ" of $3.4 \times 10^{-8}$ $C/cm^2K$, a relative dielectric constant $\epsilon r$ of 180, and a volume specific heat Cv of 3.2 $Jcm^3K$. Thus, the samples had a merit figure Fv ($=\gamma/Cv\epsilon r$) of $0.59 \times 10^{-10}$ Ccm/J. The relative dielectric constant of each of the samples was measured by using an LCR meter with a frequency of 1 kHz and an applied voltage of 1 V. The pyroelectric coefficient of the samples was represented by an average value in a temperature variation between 20°–30° C.

EXAMPLE 6

A pyroelectric infrared detector according to Example 6 is similar to the pyroelectric infrared detector of Example 4 except that a substrate 37 (see FIG. 4) has a recess instead of a through hole (a through opening) as the substrate 16 of FIG. 1.

Samples of the pyroelectric infrared detector according to Example 6 were prepared. Experiments were performed on these samples which were not subjected to a poling treatment. With respect to the samples, the productive yield was equal to 92%. The sensing portions of the samples had a pyroelectric coefficient "γ" of $3.3 \times 10^{-8}$ $C/cm^2K$, a relative dielectric constant $\epsilon r$ of 175, and a volume specific heat Cv of 3.2 $Jcm^3K$. Thus, the samples had a merit figure Fv ($=\gamma/Cv\epsilon r$) of $0.59 \times 10^{-10}$ Ccm/J. The relative dielectric constant of each of the samples was measured by using an LCR meter with a frequency of 1 kHz and an applied voltage of 1 V. The pyroelectric coefficient of the samples was represented by an average value in a temperature variation between 20°–30° C.

EXAMPLE 7

A pyroelectric infrared detector according to Example 7 is similar to the pyroelectric infrared detector of Example 3 except for design changes indicated hereinafter. In the pyroelectric infrared detector of Example 7, a substrate 37 (see FIG. 4) has a recess instead of a through hole (a through opening) as the substrate 16 of FIG. 1. In addition, a pyroelectric film 33 (see FIG. 4) is made of $PbTiO_3$.

During the fabrication of the pyroelectric infrared detector of Example 7, the pyroelectric film 33 made of $PbTiO_3$ was formed on an oxide under layer film 32 by using a plasma-enhanced MO-CVD apparatus.

Figure 9:
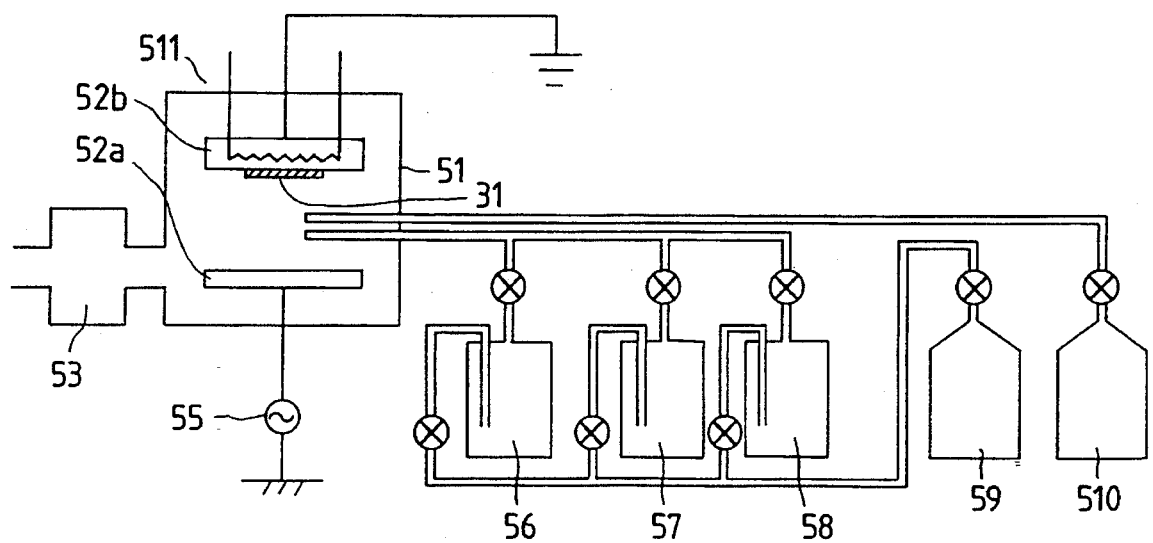
FIG. 9 is a diagram of a plasma-enhanced MO-CVD apparatus used in the fabrication of a pyroelectric infrared detector according to Example 7 of this invention.

Specifically, as shown in FIG. 9, a first substrate 31 was placed in a reaction chamber 51 of the plasma-enhanced MO-CVD apparatus. The first substrate 31 was previously heated at a temperature of 450° C. by a heater 511. The first substrate 31 was supported on a ground electrode 52b. Lead dipivaloyl methane, $Pb(C_{11}H_{19}O_2)_2$, was placed in a source vaporizer 57 and was heated by using an oil bath held at a temperature of 130° C. Lead dipivaloyl methane was vaporized as being heated. Titanium tetra-isopropoxide, $Ti(i-C_3H_7O)_4$, was placed in a source vaporizer 58 and was heated by using an oil bath held at a temperature of 50° C. Titanium tetra-isopropoxide was vaporized as being heated. Resultant lead dipivaloyl methane vapor and titanium tetra-isopropoxide vapor were driven into the reaction chamber 51 by using carrier nitrogen gas which flowed from a carrier gas cylinder 59 at a rate of 10 ml/min. Oxygen gas serving as reactant gas flowed from a reactant gas cylinder 510 at a rate of 40 ml/min, and was driven into the reaction chamber 51 via an injection nozzle. The reaction chamber 53 was exhausted via an exhaust system 53 so that the pressure in the reaction chamber 51 was held equal to a vacuum of 3.90 Pa.

Under these conditions, electromagnetic wave having a frequency of 13.56 MHz was applied from an RF power source 55 to an RF electrode 52a at a power of 400 W for 100 minutes so that plasma was generated between the RF electrode 52a and the ground electrode 52b in the reaction chamber 51 of the plasma-enhanced MO-CVD apparatus. As a result, a (100) oriented $PbTiO_3$ pyroelectric film 33 was deposited on a surface of the first substrate 11. The $PbTiO_3$ pyroelectric film 33 had a thickness of 3 μm. During the formation of the $PbTiO_3$ pyroelectric film 33, the first substrate 31 was rotated at 120 r.p.m. by a motor (not shown).

In the plasma-enhanced MO-CVD apparatus of FIG. 9, a source vaporizer 56 contained $Mg(C_{11}H_{19}O_2)_2$ for an under layer. Thus, it is possible to form the under layer and the pyroelectric film by using the same apparatus. This is effective to shorten the process time of forming the films.

Samples of the pyroelectric infrared detector according to Example 7 were prepared. Experiments were performed on these samples which were not subjected to a poling treatment. With respect to the samples, the productive yield was equal to 91%. The sensing portions of the samples had a pyroelectric coefficient "γ" of $2.0 \times 10^{-8}$ $C/cm^2K$, a relative dielectric constant $\epsilon r$ of 105, and a volume specific heat Cv of 3.2 $Jcm^3K$. Thus, the samples had a merit figure Fv ($=\gamma/Cv\epsilon r$) of $0.60 \times 10^{-10}$ Ccm/J. The relative dielectric constant of each of the samples was measured by using an LCR meter with a frequency of 1 kHz and an applied voltage of 1 V. The pyroelectric coefficient of the samples was represented by an average value in a temperature variation between 20°–30° C.

EXAMPLE 8

A pyroelectric infrared detector according to Example 8 is similar to the pyroelectric infrared detector of Example 4 except for design changes indicated hereinafter. In the pyroelectric infrared detector of Example 8, a substrate 37 (see FIG. 4) has a recess instead of a through hole (a through opening) as the substrate 16 of FIG. 1. In addition, a pyroelectric film 33 (see FIG. 4) is made of PbTiO$_3$.

During the fabrication of the pyroelectric infrared detector of Example 8, the pyroelectric film 33 made of PbTiO$_3$ was formed on an oxide under layer film 32 by using a plasma-enhanced MO-CVD apparatus as in Example 7.

Samples of the pyroelectric infrared detector according to Example 8 were prepared. Experiments were performed on these samples which were not subjected to a poling treatment. With respect to the samples, the productive yield was equal to 90%. The sensing portions of the samples had a pyroelectric coefficient "γ" of 1.9×10$^{-8}$ C/cm$^2$K, a relative dielectric constant $\epsilon r$ of 100, and a volume specific heat Cv of 3.2 Jcm$^3$K. Thus, the samples had a merit figure Fv (=γ/Cv$\epsilon$r) of 0.59×10$^{-10}$ Ccm/J. The relative dielectric constant of each of the samples was measured by using an LCR meter with a frequency of 1 kHz and an applied voltage of 1 V. The pyroelectric coefficient of the samples was represented by an average value in a temperature variation between 20°–30° C.

EXAMPLE 9

A pyroelectric infrared detector according to Example 9 is similar to the pyroelectric infrared detector of Example 3 (see FIGS. 4 and 5(a)–5(g)) except for design changes indicated hereinafter.

During the fabrication of the pyroelectric infrared detector of Example 9, an oxide under layer film 32 made of a (100) oriented MgO of the NaCl-type structure was formed on a first substrate 31 by an RF magnetron sputtering apparatus.

Specifically, a first substrate 31 was placed into the RF magnetron sputtering apparatus. An MgO sintered body having a fineness (purity) of 99.9% was used as a target in the RF magnetron sputtering apparatus. The RF magnetron sputtering apparatus was activated for 1 hour so that a (100) oriented MgO under layer film 32 of the NaCl-type structure was deposited on a given area (an exposed area) of the first substrate 31 by sputtering. During the sputtering, the first substrate 31 remained heated at a temperature of 600° C. Furthermore, sputtering gas composed of a mixture of argon (50%) and oxygen (50%) was used in the RF magnetron sputtering apparatus. The pressure of the sputtering gas was equal to 0.7 Pa. The RF power density in the RF magnetron sputtering apparatus was equal to 2.5 W/cm$^2$. The RF power had a frequency of 13.56 MHz. The MgO under layer film 32 had a thickness of 0.2

During a later stage in the fabrication of the pyroelectric infrared detector, the MgO under layer film 32 was etched off as in Example 3. The time necessary for the etching process was equal to about 75 minutes.

Samples of the pyroelectric infrared detector according to Example 9 were prepared. Experiments were performed on these samples which were not subjected to a poling treatment. With respect to the samples, the productive yield was equal to 90%. The sensing portions of the samples had a pyroelectric coefficient "γ" of 3.4×10$^{-8}$ C/cm$^2$K, a relative dielectric constant $\epsilon r$ of 180, and a volume specific heat Cv of 3.2 Jcm$^3$K. Thus, the samples had a merit figure Fv (=γ/Cv$\epsilon$r) of 0.59×10$^{-10}$ Ccm/J. The relative dielectric constant of each of the samples was measured by using an LCR meter with a frequency of 1 kHz and an applied voltage of 1 V. The pyroelectric coefficient of the samples was represented by an average value in a temperature variation between 20°–30° C.

EXAMPLE 10

A pyroelectric infrared detector according to Example 10 is similar to the pyroelectric infrared detector of Example 4 (see FIGS. 4 and 5(a)–5(g)) except for design changes indicated hereinafter.

During the fabrication of the pyroelectric infrared detector of Example 10, an oxide under layer film 32 made of a (100) oriented NiO crystal of the NaCl-type structure was formed on a first substrate 31 by an RF magnetron sputtering apparatus.

Specifically, a first substrate 31 was placed into the RF magnetron sputtering apparatus. NiO powder having a fineness (purity) of 99.9% was used as a target placed in a copper dish in the RF magnetron sputtering apparatus. The RF magnetron sputtering apparatus was activated for 1.5 hours so that a (100) oriented NiO under layer film 32 of the NaCl-type structure was deposited on a given area (an exposed area) of the first substrate 31 by sputtering. During the sputtering, the first substrate 31 remained heated at a temperature of 600° C. Furthermore, sputtering gas composed of a mixture of argon (60%) and oxygen (40%) was used in the RF magnetron sputtering apparatus. The pressure of the sputtering gas was equal to 1.1 Pa. The RF power density in the RF magnetron sputtering apparatus was equal to 2.5 W/cm$^2$. The RF power had a frequency of 13.56 MHz. The NiO under layer film 32 had a thickness of 0.2 μm.

During a later stage in the fabrication of the pyroelectric infrared detector, the NiO under layer film 32 was etched off as in Example 4. The time necessary for the etching process was equal to about 80 minutes.

Samples of the pyroelectric infrared detector according to Example 10 were prepared. Experiments were performed on these samples which were not subjected to a poling treatment. With respect to the samples, the productive yield was equal to 90%. The sensing portions of the samples had a pyroelectric coefficient "γ" of 3.3×10$^{-8}$ C/cm$^2$K, a relative dielectric constant $\epsilon r$ of 174, and a volume specific heat Cv of 3.2 Jcm$^3$K. Thus, the samples had a merit figure Fv (γ/Cv$\epsilon$r) of 0.59×10$^{-10}$ Ccm/J. The relative dielectric constant of each of the samples was measured by using an LCR meter with a frequency of 1 kHz and an applied voltage of 1 V. The pyroelectric coefficient of the samples was represented by an average value in a temperature variation between 20°–30° C.

EXAMPLE 11

A pyroelectric infrared detector according to Example 11 is similar to the pyroelectric infrared detector of Example 9 except that a substrate 37 (see FIG. 4) has a recess instead of a through hole (a through opening) as the substrate 16 of FIG. 1.

Samples of the pyroelectric infrared detector according to Example 11 were prepared. Experiments were performed on these samples which were not subjected to a poling treatment. With respect to the samples, the productive yield was equal to 89%. The sensing portions of the samples had a pyroelectric coefficient "γ" of 3.4×10$^{-8}$ C/cm$^2$K, a relative dielectric constant $\epsilon r$ of 182, and a volume specific heat Cv of 3.2 Jcm$^3$K. Thus, the samples had a merit figure Fv (=γ/Cv$\epsilon$r) of 0.58×10$^{-10}$ Ccm/J. The relative dielectric constant of each of the samples was measured by using an LCR meter with a frequency of 1 kHz and an applied voltage of 1 V. The pyroelectric coefficient of the samples was represented by an average value in a temperature variation between 20°–30° C.

EXAMPLE 12

A pyroelectric infrared detector according to Example 12 is similar to the pyroelectric infrared detector of Example 10 except that a substrate 37 (see FIG. 4) has a recess instead of a through hole (a through opening) as the substrate 16 of FIG. 1.

Samples of the pyroelectric infrared detector according to Example 12 were prepared. Experiments were performed on these samples which were not subjected to a poling treatment. With respect to the samples, the productive yield was equal to 90%. The sensing portions of the samples had a pyroelectric coefficient "$\gamma$" of $3.2\times10^{-8}$ C/cm$^2$K, a relative dielectric constant $\epsilon r$ of 170, and a volume specific heat Cv of 3.2 Jcm$^3$K. Thus, the samples had a merit figure Fv ($=\gamma/Cv\epsilon r$) of $0.59\times10^{-10}$ Ccm/J. The relative dielectric constant of each of the samples was measured by using an LCR meter with a frequency of 1 kHz and an applied voltage of 1 V. The pyroelectric coefficient of the samples was represented by an average value in a temperature variation between 20°–30° C.

EXAMPLE 13

A pyroelectric infrared detector according to Example 13 is similar to the pyroelectric infrared detector of Example 9 except for design changes indicated hereinafter. In the pyroelectric infrared detector of Example 13, a substrate 37 (see FIG. 4) has a recess instead of a through hole (a through opening) as the substrate 16 of FIG. 1. Furthermore, a pyroelectric film 33 (see FIG. 4) is made of PbTiO$_3$ as in Example 7.

Samples of the pyroelectric infrared detector according to Example 13 were prepared. Experiments were performed on these samples which were not subjected to a poling treatment. With respect to the samples, the productive yield was equal to 89%. The sensing portions of the samples had a pyroelectric coefficient "$\gamma$" of $1.9\times10^{-8}$ C/cm$^2$K, a relative dielectric constant $\epsilon r$ of 100, and a volume specific heat Cv of 3.2 Jcm$^3$K. Thus, the samples had a merit figure Fv ($=\gamma/Cv\epsilon r$) of $0.59\times10^{-10}$ Ccm/J. The relative dielectric constant of each of the samples was measured by using an LCR meter with a frequency of 1 kHz and an applied voltage of 1 V. The pyroelectric coefficient of the samples was represented by an average value in a temperature variation between 20°–30° C.

EXAMPLE 14

A pyroelectric infrared detector according to Example 14 is similar to the pyroelectric infrared detector of Example 10 except for design changes indicated hereinafter. In the pyroelectric infrared detector of Example 14, a substrate 37 (see FIG. 4) has a recess instead of a through hole (a through opening) as the substrate 16 of FIG. 1. Furthermore, a pyroelectric film 33 (see FIG. 4) is made of PbTiO$_3$ as in Example 8.

Samples of the pyroelectric infrared detector according to Example 14 were prepared. Experiments were performed on these samples which were not subjected to a poling treatment. With respect to the samples, the productive yield was equal to 91%. The sensing portions of the samples had a pyroelectric coefficient "$\gamma$" of $1.9\times10^{-8}$ C/cm$^2$K, a relative dielectric constant $\epsilon r$ of 100, and a volume specific heat Cv of 3.2 Jcm$^3$K. Thus, the samples had a merit figure Fv ($=\gamma/Cv\epsilon r$) of $0.59\times10^{-10}$ Ccm/J. The relative dielectric constant of each of the samples was measured by using an LCR meter with a frequency of 1 kHz and an applied voltage of 1 V. The pyroelectric coefficient of the samples was represented by an average value in a temperature variation between 20°–30° C.

EXAMPLE 15

A pyroelectric infrared detector according to Example 15 is similar to the pyroelectric infrared detector of Example 5 except for design changes indicated hereinafter. A first substrate 31 (see FIGS. 5(a)–5(e)) used in the fabrication of the pyroelectric infrared detector of Example 15 was made of soda-lime glass identified by Corning #7059.

A sample of the pyroelectric infrared detector according to Example 15 was prepared. Experiments were performed on the sample which was not subjected to a poling treatment. The sensing portion of the sample had a pyroelectric coefficient "$\gamma$" of $3.0\times10^{-8}$ C/cm$^2$K, a relative dielectric constant $\epsilon r$ of 180, and a volume specific heat Cv of 3.2 Jcm$^3$K. Thus, the sample had a merit figure Fv ($=\gamma/Cv\epsilon r$) of $0.52\times10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 16

A pyroelectric infrared detector according to Example 16 is similar to the pyroelectric infrared detector of Example 15 except for design changes indicated hereinafter. During the fabrication of the pyroelectric infrared detector of Example 16, an MgO under layer film 32 (see FIGS. 5(a)–5(e))was formed by RF magnetron sputtering.

A sample of the pyroelectric infrared detector according to Example 16 was prepared. Experiments were performed on the sample which was not subjected to a poling treatment. The sensing portion of the sample had a pyroelectric coefficient "$\gamma$" of $3.1\times10^{-8}$ C/cm$^2$K, a relative dielectric constant $\epsilon r$ of 178, and a volume specific heat Cv of 3.2 Jcm$^3$K. Thus, the sample had a merit figure Fv ($=\gamma/Cv\epsilon r$) of $0.54\times10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 17

A pyroelectric infrared detector according to Example 17 is similar to the pyroelectric infrared detector of Example 15 except for design changes indicated hereinafter. During the fabrication of the pyroelectric infrared detector of Example 17, a pyroelectric film 33 (see FIG. 4) was made of PbTiO$_3$ by a plasma-enhanced MO-CVD process.

A sample of the pyroelectric infrared detector according to Example 17 was prepared. Experiments were performed on the sample which was not subjected to a poling treatment. The sensing portion of the sample had a pyroelectric coefficient "$\gamma$" of $2.0\times10^{-8}$ C/cm$^2$K, a relative dielectric constant $\epsilon r$ of 120, and a volume specific heat Cv of 3.2 Jcm$^3$K. Thus, the sample had a merit figure FV ($=\gamma/Cv\epsilon r$) of $0.52\times10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 18

A pyroelectric infrared detector according to Example 18 is similar to the pyroelectric infrared detector of Example 16 except for design changes indicated hereinafter. During the fabrication of the pyroelectric infrared detector of Example 18, a pyroelectric film 33 (see FIG. 4) was made of PbTiO$_3$ by a plasma-enhanced MO-CVD process.

A sample of the pyroelectric infrared detector according to Example 18 was prepared. Experiments were performed on the sample which was not subjected to a poling treatment. The sensing portion of the sample had a pyroelectric coefficient "γ" of $1.9 \times 10^{-8}$ C/cm$^2$K, a relative dielectric constant $\epsilon r$ of 115, and a volume specific heat Cv of 3.2 Jcm$^3$K. Thus, the sample had a merit figure Fv ($=\gamma/Cv\epsilon r$) of $0.52 \times 10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 19

A pyroelectric infrared detector according to Example 19 is similar to the pyroelectric infrared detector of Example 15 except for design changes indicated hereinafter. An oxide under layer film 32 (see FIGS. 5(*a*)–5(*e*)) used in the fabrication of the pyroelectric infrared detector of Example 19 was made of NiO.

A sample of the pyroelectric infrared detector according to Example 19 was prepared. Experiments were performed on the sample which was not subjected to a poling treatment. The sensing portion of the sample had a pyroelectric coefficient "γ" of $2.9 \times 10^{-8}$ C/cm$^2$K, a relative dielectric constant $\epsilon r$ of 180, and a volume specific heat Cv of 3.2 Jcm$^3$K. Thus, the sample had a merit figure Fv ($=\gamma/Cv\epsilon r$) of $0.50 \times 10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 20

A pyroelectric infrared detector according to Example 20 is similar to the pyroelectric infrared detector of Example 16 except for design changes indicated hereinafter. An oxide under layer film 32 (see FIGS. 5(*a*)–5(*e*)) used in the fabrication of the pyroelectric infrared detector of Example 20 was made of NiO.

A sample of the pyroelectric infrared detector according to Example 19 was prepared. Experiments were performed on the sample which was not subjected to a poling treatment. The sensing portion of the sample had a pyroelectric coefficient "γ" of $2.8 \times 10^{-8}$ C/cm$^2$K, a relative dielectric constant $\epsilon r$ of 179, and a volume specific heat Cv of 3.2 Jcm$^3$K. Thus, the sample had a merit figure Fv ($=\gamma/Cv\epsilon r$) of $0.49 \times 10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 21

A pyroelectric infrared detector according to Example 21 is similar to the pyroelectric infrared detector of Example 15 except for design changes indicated hereinafter. A first substrate 31 (see FIGS. 5(*a*)–5(*e*)) used in the fabrication of the pyroelectric infrared detector of Example 21 was made of an Si (100) single crystal, that is, an Si single crystal exposed along a (100) plane.

A sample of the pyroelectric infrared detector according to Example 21 was prepared. Experiments were performed on the sample which was not subjected to a poling treatment. The sensing portion of the sample had a pyroelectric coefficient "γ" of $3.2 \times 10^{-8}$ C/cm$^2$K, a relative dielectric constant $\epsilon r$ of 176, and a volume specific heat Cv of 3.2 Jcm$^3$K. Thus, the sample had a merit figure Fv ($=\gamma/Cv\epsilon r$) of $0.57 \times 10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 22

A pyroelectric infrared detector according to Example 22 is similar to the pyroelectric infrared detector of Example 16 except for design changes indicated hereinafter. A first substrate 31 (see FIGS. 5(*a*)–5(*e*)) used in the fabrication of the pyroelectric infrared detector of Example 22 was made of an Si (100) single crystal, that is, an Si single crystal exposed along a (100) plane.

A sample of the pyroelectric infrared detector according to Example 22 was prepared. Experiments were performed on the sample which was not subjected to a poling treatment. The sensing portion of the sample had a pyroelectric coefficient "γ" of $3.2 \times 10^{-8}$ C/cm$^2$K, a relative dielectric constant $\epsilon r$ of 177, and a volume specific heat Cv of 3.2 Jcm$^3$K. Thus, the sample had a merit figure Fv ($=\gamma/Cv\epsilon r$) of $0.56 \times 10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 23

A pyroelectric infrared detector according to Example 23 is similar to the pyroelectric infrared detector of Example 19 except for design changes indicated hereinafter. A first substrate 31 (see FIGS. 5(*a*)–5(*e*)) used in the fabrication of the pyroelectric infrared detector of Example 23 was made of an Si (100) single crystal, that is, an Si single crystal exposed along a (100) plane.

A sample of the pyroelectric infrared detector according to Example 23 was prepared. Experiments were performed on the sample which was not subjected to a poling treatment. The sensing portion of the sample had a pyroelectric coefficient "γ" of $3.1 \times 10^{-8}$ C/cm$^2$K, a relative dielectric constant $\epsilon r$ of 180, and a volume specific heat Cv of 3.2 Jcm$^3$K. Thus, the sample had a merit figure Fv ($=\gamma/C\epsilon r$) of $0.54 \times 10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 24

A pyroelectric infrared detector according to Example 24 is similar to the pyroelectric infrared detector of Example 20except for design changes indicated hereinafter. A first substrate 31 (see FIGS. 5(*a*)–5(*e*)) used in the fabrication of the pyroelectric infrared detector of Example 24 was made of an Si (100) single crystal, that is, an Si single crystal exposed along a (100) plane.

A sample of the pyroelectric infrared detector according to Example 24 was prepared. Experiments were performed on the sample which was not subjected to a poling treatment. The sensing portion of the sample had a pyroelectric coefficient "$\gamma$" of $3.2 \times 10^{-8}$ C/cm$^2$K, a relative dielectric constant $\epsilon r$ of 178, and a volume specific heat Cv of 3.2 Jcm$^3$K. Thus, the sample had a merit figure Fv ($=\gamma/Cv\epsilon r$) of $0.56 \times 10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 25

A pyroelectric infrared detector according to Example 25 is similar to the pyroelectric infrared detector of Example 15 except for design changes indicated hereinafter. A first substrate 31 (see FIGS. 5(a)–5(e)) used in the fabrication of the pyroelectric infrared detector of Example 25 was made of an Si (111) single crystal, that is, an Si single crystal exposed along a (111) plane.

A sample of the pyroelectric infrared detector according to Example 25 was prepared. Experiments were performed on the sample which was not subjected to a poling treatment. The sensing portion of the sample had a pyroelectric coefficient "$\gamma$" of $3.2 \times 10^{-8}$ C/cm$^2$K, a relative dielectric constant $\epsilon r$ of 178, and a volume specific heat Cv of 3.2 Jcm$^3$K. Thus, the sample had a merit figure Fv ($=\gamma/Cv\epsilon r$) of $0.56 \times 10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 26

A pyroelectric infrared detector according to Example 26 is similar to the pyroelectric infrared detector of Example 16 except for design changes indicated hereinafter. A first substrate 31 (see FIGS. 5(a)–5(e)) used in the fabrication of the pyroelectric infrared detector of Example 26 was made of an Si (111) single crystal, that is, an Si single crystal exposed along a (111) plane.

A sample of the pyroelectric infrared detector according to Example 26 was prepared. Experiments were performed on the sample which was not subjected to a poling treatment. The sensing portion of the sample had a pyroelectric coefficient "$\gamma$" of $3.2 \times 10^{-8}$ C/cm$^2$K, a relative dielectric constant $\epsilon r$ of 178, and a volume specific heat Cv of 3.2 Jcm$^3$K. Thus, the sample had a merit figure Fv ($=\gamma/Cv\epsilon r$) of $0.56 \times 10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 27

A pyroelectric infrared detector according to Example 27 is similar to the pyroelectric infrared detector of Example 19 except for design changes indicated hereinafter. A first substrate 31 (see FIGS. 5(a)–5(e)) used in the fabrication of the pyroelectric infrared detector of Example 27 was made of an Si (111) single crystal, that is, an Si single crystal exposed along a (111) plane.

A sample of the pyroelectric infrared detector according to Example 27 was prepared. Experiments were performed on the sample which was not subjected to a poling treatment. The sensing portion of the sample had a pyroelectric coefficient "$\gamma$" of $3.1 \times 10^{-8}$ C/cm$^2$K, a relative dielectric constant $\epsilon r$ of 180, and a volume specific heat Cv of 3.2 Jcm$^3$K. Thus, the sample had a merit figure Fv ($=\gamma/Cv\epsilon r$) of $0.54 \times 10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 28

A pyroelectric infrared detector according to Example 28 is similar to the pyroelectric infrared detector of Example 20 except for design changes indicated hereinafter. A first substrate 31 (see FIGS. 5(a)–5(e)) used in the fabrication of the pyroelectric infrared detector of Example 28 was made of an Si (111) single crystal, that is, an Si single crystal exposed along a (111) plane.

A sample of the pyroelectric infrared detector according to Example 28 was prepared. Experiments were performed on the sample which was not subjected to a poling treatment. The sensing portion of the sample had a pyroelectric coefficient "$\gamma$" of $3.1 \times 10^{-8}$ C/cm$^2$K, a relative dielectric constant $\epsilon r$ of 180, and a volume specific heat Cv of 3.2 Jcm$^3$K. Thus, the sample had a merit figure Fv ($=\gamma/Cv\epsilon r$) of $0.54 \times 10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 29

A pyroelectric infrared detector according to Example 29 is similar to the pyroelectric infrared detector of Example 15 except for design changes indicated hereinafter. A first substrate 31 (see FIGS. 5(a)–5(e)) used in the fabrication of the pyroelectric infrared detector of Example 29 was made of a sintered alumina body.

A sample of the pyroelectric infrared detector according to Example 29 was prepared. Experiments were performed on the sample which was not subjected to a poling treatment. The sensing portion of the sample had a pyroelectric coefficient "$\gamma$" of $3.1 \times 10^{-8}$ C/cm$^2$K, a relative dielectric constant $\epsilon r$ of 180, and a volume specific heat Cv of 3.2 Jcm$^3$K. Thus, the sample had a merit figure Fv ($=\gamma/Cv\epsilon r$) of $0.54 \times 10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 30

A pyroelectric infrared detector according to Example 30 is similar to the pyroelectric infrared detector of Example 16 except for design changes indicated hereinafter. A first substrate 31 (see FIGS. 5(a)–5(e)) used in the fabrication of the pyroelectric infrared detector of Example 30 was made of a sintered alumina body.

A sample of the pyroelectric infrared detector according to Example 30 was prepared. Experiments were performed on the sample which was not subjected to a poling treatment. The sensing portion of the sample had a pyroelectric coefficient "$\gamma$" of $3.0\times10^{-8}$ C/cm$^2$K, a relative dielectric constant $\epsilon r$ of 178, and a volume specific heat Cv of 3.2 Jcm$^3$K. Thus, the sample had a merit figure Fv ($=\gamma/Cv\epsilon r$) of $0.53\times10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 31

A pyroelectric infrared detector according to Example 31 is similar to the pyroelectric infrared detector of Example 19 except for design changes indicated hereinafter. A first substrate 31 (see FIGS. 5(*a*)–5(*e*)) used in the fabrication of the pyroelectric infrared detector of Example 31 was made of a sintered alumina body.

A sample of the pyroelectric infrared detector according to Example 31 was prepared. Experiments were performed on the sample which was not subjected to a poling treatment. The sensing portion of the sample had a pyroelectric coefficient "$\gamma$" of $2.9\times10^{-8}$ C/cm$^2$K, a relative dielectric constant $\epsilon r$ of 178, and a volume specific heat Cv of 3.2 Jcm$^3$K. Thus, the sample had a merit figure Fv ($=\gamma/Cv\epsilon r$) of $0.51\times10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 32

A pyroelectric infrared detector according to Example 32 is similar to the pyroelectric infrared detector of Example 20 except for design changes indicated hereinafter. A first substrate 31 (see FIGS. 5(*a*)–5(*e*)) used in the fabrication of the pyroelectric infrared detector of Example 32 was made of a sintered alumina body.

A sample of the pyroelectric infrared detector according to Example 32 was prepared. Experiments were performed on the sample which was not subjected to a poling treatment. The sensing portion of the sample had a pyroelectric coefficient "$\gamma$" of $2.9\times10^{-8}$ C/cm$^2$K, a relative dielectric constant $\epsilon r$ of 178, and a volume specific heat Cv of 3.2 Jcm$^3$K. Thus, the sample had a merit figure Fv ($=\gamma/Cv\epsilon r$) of $0.51\times10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 33

A pyroelectric infrared detector according to Example 33 is similar to the pyroelectric infrared detector of Example 31 except for design changes indicated hereinafter. During the fabrication of the pyroelectric infrared detector of Example 33, a pyroelectric film 33 (see FIG. 4) was made of PbTiO$_3$ by a plasma-enhanced MO-CVD process.

A sample of the pyroelectric infrared detector according to Example 33 was prepared. Experiments were performed on the sample which was not subjected to a poling treatment. The sensing portion of the sample had a pyroelectric coefficient "$\gamma$" of $2.0\times10^{-8}$ C/cm$^2$K, a relative dielectric constant $\epsilon r$ of 120, and a volume specific heat Cv of 3.2 Jcm$^3$K. Thus, the sample had a merit figure Fv ($=\gamma/Cv\epsilon r$) of $0.52\times10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 34

A pyroelectric infrared detector according to Example 34 is similar to the pyroelectric infrared detector of Example 32 except for design changes indicated hereinafter. During the fabrication of the pyroelectric infrared detector of Example 34, a pyroelectric film 33 (see FIG. 4) was made of PbTiO$_3$ by a plasma-enhanced MO-CVD process.

A sample of the pyroelectric infrared detector according to Example 34 was prepared. Experiments were performed on the sample which was not subjected to a poling treatment. The sensing portion of the sample had a pyroelectric coefficient "$\gamma$" of $1.9\times10^{-8}$ C/cm$^2$K, a relative dielectric constant $\epsilon r$ of 122, and a volume specific heat Cv of 3.2 Jcm$^3$K. Thus, the sample had a merit figure Fv ($=\gamma/Cv\epsilon r$) of $0.49\times10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 35

With reference to FIG. 10, a pyroelectric infrared detector according to Example 35 includes a substrate 71 made of soda-lime glass identified by Corning #7059. A lower electrode layer or a bottom electrode layer 72 made of (100) oriented p-type semiconductor of NiO extends on a given area of an upper surface of the substrate 71. The NiO layer 72 has a crystal structure of the NaCl type. A pyroelectric film 73 made of Pb$_{0.9}$La$_{0.1}$Ti$_{0.975}$O$_3$ extends on a given portion of the lower electrode layer 72 and a given exposed portion of the upper surface of the substrate 71. The lower electrode layer 72 thus lies between the substrate 71 and the pyroelectric film 73. An upper electrode layer or a sensing electrode layer 74 made of Ni—Cr extends on an upper surface of the pyroelectric film 73, extending downward along a side of the pyroelectric film and then extending outward along the upper surface of the substrate 71. In this way, the lower and upper electrodes 72 and 74 are electrically connected to the lower and upper surfaces of the pyroelectric film 73 respectively.

The lower electrode layer 72 has the following functions in addition to the electrode function. During the formation of the pyroelectric film 73, the p-type semiconductor in the lower electrode layer 72 compensated for a lattice-constant misfit with the pyroelectric film 73 and thereby improved the orientation characteristics of the pyroelectric film 73. The lower electrode layer 72 has a relatively small thermal conductivity, effectively suppressing the escape of heat from the pyroelectric film 73 to the substrate 72. This design enables a high infrared sensitivity.

The pyroelectric infrared detector of FIG. 10 was fabricated as follows. With reference to FIG. 11(*a*), a substrate 71 was prepared. The substrate was made of soda-lime glass identified by Corning #7059. A lower electrode layer 72 was formed on a given area of a surface of the substrate 71 by an RF magnetron sputtering apparatus. The lower electrode layer 72 was made of (100) oriented p-type semiconductor of NiO. The formation of an NiO layer corresponding to the lower electrode layer 72 was executed in an atmosphere containing an excessive amount of oxygen which oxidized NiO further and converted some of $Ni^{2+}$ ions to $Ni^{3+}$ ions. This ion conversion caused holes so that the resultant NiO layer 72 was a p-type semiconductor. The NiO layer 72 had a crystal structure of the NaCl type.

Specifically, the substrate 71 was placed into the RF magnetron sputtering apparatus. NiO powder having a fineness (purity) of 99.9% was used as a target placed in a copper dish in the RF magnetron sputtering apparatus. The RF magnetron sputtering apparatus was activated for 1.5 hours so that a (100) oriented NiO layer was deposited on a given area (an exposed area) of the substrate 71 by sputtering. During the sputtering, the substrate 71 remained heated at a temperature of 200° C. Furthermore, an atmosphere or sputtering gas composed of a mixture of argon (10%) and oxygen (90%) was used in the RF magnetron sputtering apparatus. Thus, the resultant NiO layer was a p-type semiconductor. The pressure of the sputtering gas was equal to 1.1 Pa. The RF power density in the RF magnetron sputtering apparatus was equal to 2.5 $W/cm^2$. The RF power had a frequency of 13.56 MHz. The resultant NiO layer had a thickness of 0.2 μm. The resistivity of the NiO layer was equal to $4.5 \times 10^{-1}$ Ωcm at a temperature of 300 K. The NiO layer was made into a lower electrode layer 72 by a patterning process using photolithography.

As shown in FIG. 11(b), after the formation of the lower electrode layer 72, a pyroelectric film 73 made of $Pb_{0.9}La_{0.1}Ti_{0.975}O_3$ was formed on a given portion of the lower electrode layer 72 and a given exposed portion of the substrate 71 by RF magnetron sputtering as in Example 1. Subsequently, an Ni—Cr film having a thickness of 10 nm was formed on exposed portions of the substrate 71 and the pyroelectric film 73. Finally, as shown in FIG. 11(c), the Ni—Cr film was made into an upper electrode layer 74 and extensions thereof by a patterning process.

A sample of the pyroelectric infrared detector according to Example 35 was prepared. Experiments were performed on the sample which was not subjected to a poling treatment. The sensing portion of the sample had a pyroelectric coefficient "γ" of $2.7 \times 10^{-8}$ $C/cm^2 K$, a relative dielectric constant ∈r of 175, and a volume specific heat Cv of 3.2 $Jcm^3 K$. Thus, the sample had a merit figure Fv (=γ/C∈r) of $0.48 \times 10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

A sample of the $Pb_{0.9}La_{0.1}Ti_{0.975}O_3$ pyroelectric film 73 was prepared which extended on the lower electrode 72 and the substrate 71. Experiments were performed to analyze this sample by x-ray diffraction. An experimentally-obtained x-ray diffraction pattern of the sample is similar to the x-ray diffraction pattern of FIG. 8. The rate or percentage "α" of the c-axis orientation of the sample was calculated by referring to the previously-mentioned equation (1). The result of the calculation of the rate "α" was equal to 88%. It should be noted that the c-axis orientation means (001)-plane orientation.

The coefficient of thermal conductivity of NiO in the lower electrode 72 is equal to about 17 W/mk whereas the coefficient of thermal conductivity of MgO is equal to about 60 W/mk. Therefore, the coefficient of thermal conductivity of NiO is equal to about 25% of that of MgO. The lower layer 72 extending between the substrate 71 and the pyroelectric film 73 is thus small in coefficient of thermal conductivity so that heat transfer from the pyroelectric film 73 to the substrate 71 can be effectively suppressed. Accordingly, the substrate 71 can be used in a final product, and it is unnecessary to separate and remove the substrate 71. Furthermore, an etching process to remove the substrate 71 is unnecessary, and a damage to the pyroelectric film 73 by the etching process is prevented and the method of fabricating the pyroelectric infrared detector can be simplified.

EXAMPLE 36

A pyroelectric infrared detector according to Example 36 is similar to the pyroelectric infrared detector of Example 35 except for design changes indicated hereinafter. In the pyroelectric infrared detector of Example 36, a lower electrode layer 72 (see FIG. 10) is made of (100) oriented p-type semiconductor of Li-doped NiO, that is, $Li_x Ni_{1-x} O$ where "x" denotes an Li atomic fraction. The atomic fraction "x" is preferably equal to 0.03 (3 atm %).

During the fabrication of the pyroelectric infrared detector of Example 36, the lower electrode layer 72 was formed by a plasma-enhanced MO-CVD apparatus.

Specifically, a substrate 71 (see FIG. 10) was placed in a reaction chamber of the plasma-enhanced MO-CVD apparatus having first and second source vaporizers. The substrate 71 was previously heated at a temperature of 350° C. by a heater. The substrate 71 was supported on a ground electrode in the plasma-enhanced MO-CVD apparatus. Nickel acetylacetonate, $Ni(C_5H_7O_2)_2 H_2O$, was placed in the first source vaporizer and was heated by using an oil bath held at a temperature of 160° C. Nickel acetylacetonate was vaporized as being heated. Resultant nickel acetylacetonate vapor was driven into the reaction chamber by using carrier nitrogen gas which was fed from a carrier gas cylinder at a flow rate of 35 ml/min. Lithium dipivaloyl methane, $Li(C_{11}H_{19}O_2)$, was placed in the second source vaporizer and was heated by using an oil bath held at a temperature of 200° C. Lithium dipivaloyl methane was vaporized as being heated. Resultant lithium dipivaloyl methane vapor was driven into the reaction chamber by using carrier nitrogen gas which was fed from the carrier gas cylinder at a flow rate of 2 ml/min. Oxygen gas serving as reactant gas flowed from a reactant gas cylinder at a rate of 15 ml/min, and was driven into the reaction chamber via an injection nozzle. The reaction chamber was exhausted via an exhaust system so that the pressure in the reaction chamber was held equal to a vacuum of 8.10 Pa.

Under these conditions, electromagnetic wave having a frequency of 13.56 MHz was applied from an RF power source to an RF electrode in the plasma-enhanced MO-CVD apparatus at a power of 400 W for 10 minutes so that plasma was generated between the RF electrode and the ground electrode. As a result, a (100) oriented Li-doped NiO layer was deposited on a surface of the substrate 71. The doping with Li converted some of $Ni^{2+}$ ions to $Ni^{3+}$ ions in the NiO layer so that holes were generated therein and hence the resultant NiO layer was a p-type semiconductor. The Li-doped NiO layer had a crystal structure of the NaCl type. The Li-doped NiO layer had a thickness of 2,000 angstroms. During the formation of the Li-doped NiO layer, the substrate 71 was rotated at 120 r.p.m. by a motor. The resistivity of the Li-doped NiO layer was equal to $9.0 \times 10^{-1}$ Ωcm at a temperature of 300 K. The Li-doped NiO layer was made into a lower electrode layer 72 by a patterning process using photolithography.

A sample of the pyroelectric infrared detector according to Example 36 was prepared. Experiments were performed on the sample which was not subjected to a poling treatment. The sensing portion of the sample had a pyroelectric coefficient "$\gamma$" of $2.7 \times 10^{-8}$ C/cm$^2$K, a relative dielectric constant $\epsilon r$ of 176, and a volume specific heat Cv of 3.2 Jcm$^3$K. Thus, the sample had a merit figure Fv ($=\gamma/\text{Cv}\epsilon r$) of $0.48 \times 10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 37

A pyroelectric infrared detector according to Example 37 is similar to the pyroelectric infrared detector of Example 35 except that a portion of a substrate 71 (see FIG. 10) which extends below a pyroelectric film 73 (see FIG. 10) is removed by etching.

A sample of the pyroelectric infrared detector according to Example 37 was prepared. Experiments were performed on the sample which was not subjected to a poling treatment. The sensing portion of the sample had a pyroelectric coefficient "$\gamma$" of $3.3 \times 10^{-8}$ C/cm$^2$K, a relative dielectric constant $\epsilon r$ of 176, and a volume specific heat Cv of 3.2 Jcm$^3$K. Thus, the sample had a merit figure Fv ($=\gamma/\text{Cv}\epsilon r$) of $0.59 \times 10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

EXAMPLE 38

A pyroelectric infrared detector according to Example 38 is similar to the pyroelectric infrared detector of Example 36 except that a portion of a substrate 71 (see FIG. 10) which extends below a pyroelectric film 73 (see FIG. 10) is removed by etching.

A sample of the pyroelectric infrared detector according to Example 38 was prepared. Experiments were performed on the sample which was not subjected to a poling treatment. The sensing portion of the sample had a pyroelectric coefficient "$\gamma$" of $3.3 \times 10^{-8}$ C/cm$^2$K, a relative dielectric constant $\epsilon r$ of 174, and a volume specific heat Cv of 3.2 Jcm$^3$K. Thus, the sample had a merit figure Fv ($=\gamma/\text{Cv}\epsilon r$) of $0.59 \times 10^{-10}$ Ccm/J. The relative dielectric constant of the sample was measured by using an LCR meter with a frequency of 1 kHz and an applied voltage of 1 V. The pyroelectric coefficient of the sample was represented by an average value in a temperature variation between 20°–30° C.

What is claimed is:

1. A pyroelectric infrared detector comprising:

a substrate having a recess;

a pyroelectric portion substantially aligning with the recess and having an area smaller than an area of the recess;

means for supporting the pyroelectric portion on the substrate, the supporting means including a resin film located between the substrate and the pyroelectric portion, wherein the recess faces the resin film; and first and second electrodes connected to first and second surfaces of the pyroelectric portion respectively.

2. The pyroelectric infrared detector of claim 1, wherein the pyroelectric portion comprises a pyroelectric film oriented in a direction along an axis of polarization.

3. The pyroelectric infrared detector of claim 1, wherein the resin film comprises a polyimide resin film.

4. The pyroelectric infrared detector of claim 1, wherein the pyroelectric portion comprises a pyroelectric film oriented in a (001)-axis direction and having a polarization axis perpendicular to a main surface of the substrate.

5. A pyroelectric infrared detector comprising:

a substrate having a recess;

a pyroelectric portion substantially aligning with the recess;

a resin film located between the substrate and the pyroelectric portion, wherein the recess faces the resin film; and first and second electrodes connected to first and second surfaces of the pyroelectric portion respectively;

wherein the pyroelectric portion comprises a pyroelectric film of Pb$_x$La$_y$Ti$_z$Zr$_w$O$_3$ where atomic fractions "w", "x", "y", and "z" satisfy one of the following conditions a), b), and c):

a) $0.7 \leq x \leq 1$, $x+y-1$, $0.925 \leq z \leq 1$, $w=0$ b) $x=1$, $y=0$, $0.45 \leq z < 1$ m $z+w=1$ c) $0.75 \leq x < 1$, $x+y=1$, $0.5 \leq z < 1$, $z+w=1$.

6. A pyroelectric infrared detector comprising:

a substrate;

a bottom electrode extending on the substrate and being made of (100) oriented oxide having a crystal structure of an NaCl type;

a pyroelectric portion extending on the bottom electrode; and a sensing electrode extending on the pyroelectric portion.

7. The pyroelectric infrared detector of claim 6, wherein the pyroelectric portion comprises a pyroelectric film of (001) oriented Pb$_x$La$_y$Ti$_z$Zr$_w$O$_3$ where atomic fractions "w", "x", "y", and "z" satisfy one of following conditions a), b), and c):

a) $0.7 \leq x \leq 1$, $x+y=1$, $0.925 \leq z \leq 1$, $w=0$ b) $x=1$, $y=0$, $0.45 \leq z < 1$, $z+w=1$ c) $0.75 \leq x < 1$, $x+y=1$, $0.5 \leq z < 1$, $z+w=1$.

8. The pyroelectric infrared detector of claim 6, wherein the bottom electrode is made of (100) NiO.

\* \* \* \* \*